United States Patent [19]

Beasom

[11] 4,398,142

[45] Aug. 9, 1983

[54] KELVIN-CONNECTED BURIED ZENER VOLTAGE REFERENCE CIRCUIT

[75] Inventor: James D. Beasom, Melbourne, Fla.

[73] Assignee: Harris Corporation, Melbourne, Fla.

[21] Appl. No.: 310,035

[22] Filed: Oct. 9, 1981

[51] Int. Cl.³ ............................................. G05F 3/18
[52] U.S. Cl. .................................... 323/226; 307/318; 323/231; 323/313; 323/907
[58] Field of Search ................... 307/296 R, 297, 302, 307/318; 323/223, 225, 226, 231, 311, 313, 907

[56] References Cited

U.S. PATENT DOCUMENTS

| | | | |
|---|---|---|---|
| 3,881,179 | 4/1975 | Howard, Jr. ......................... | 357/13 |
| 4,136,349 | 1/1979 | Tsang ................................... | 357/13 |
| 4,258,311 | 3/1981 | Tokuda et al. ...................... | 323/313 |
| 4,313,083 | 1/1982 | Gilbert et al. ................. | 323/231 X |
| 4,315,209 | 2/1982 | Schmoock ........................... | 323/313 |

OTHER PUBLICATIONS

"Circuit Techniques for Achieving High Speed-High Resolution A/D Conversion", IEEE Journal of Solid-State Circuits, vol. SC-15, No. 6, pp. 1046, 1047, (1980).

Primary Examiner—A. D Pellinen
Attorney, Agent, or Firm—Leitner, Palan, Martin and Bernstein

[57] ABSTRACT

An improved voltage reference circuit is provided comprising a series combination of a Kelvin-connected buried zener diode and a transistor. The collector of the transistor is connected to the first anode of the diode while the base of the transistor is connected to the second anode of the diode. This connection provides compensation for temperature and voltage variations in the zener diode caused by anode parasitic resistances and external temperature changes.

8 Claims, 2 Drawing Figures

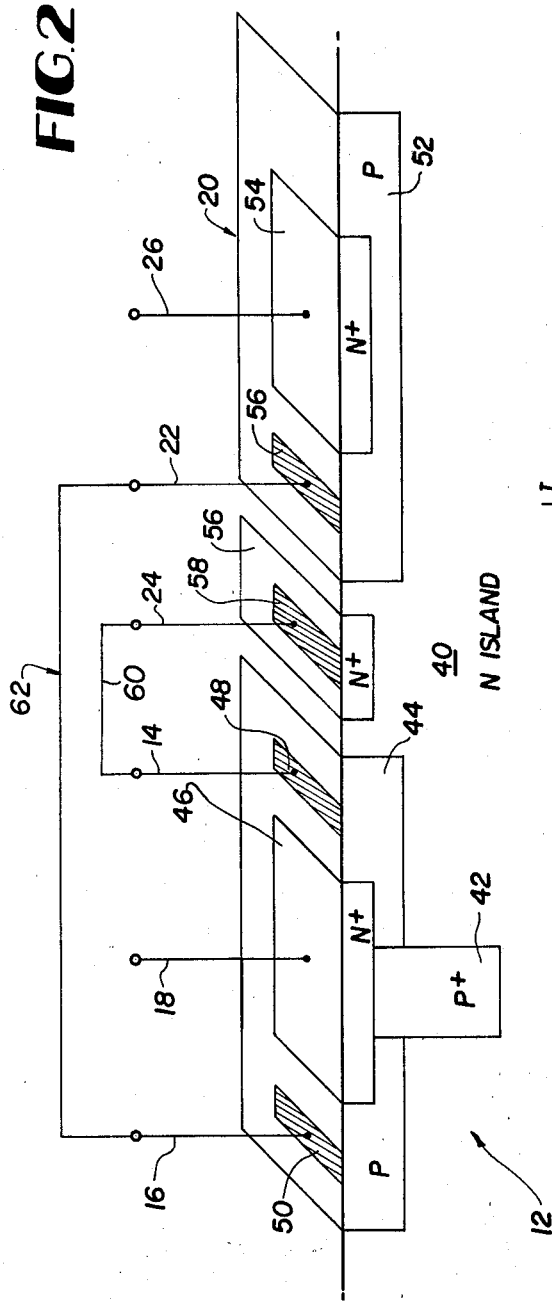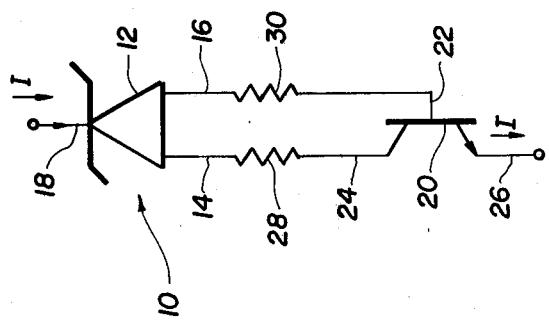

4,398,142

KELVIN-CONNECTED BURIED ZENER VOLTAGE REFERENCE CIRCUIT

BACKGROUND OF THE INVENTION

The instant invention is directed to voltage reference circuits and, more specifically, to an improved Kelvin-connected buried zener diode voltage reference circuit.

The use of a zener diode as the reference element in a voltage reference circuit is well-known. It is also known in the prior art to provide such reference circuits with a subsurface breakdown zener diode; i.e., a buried zener. This type of diode, which is seen in U.S. Pat. No. 4,136,349 to Tsang, is more stable than conventional zener diodes making it ideal for precision circuits. Further, it is also well-known to provide a buried zener diode with a double-anode structure, or Kelvin-connection, as seen in FIG. 3 of U.S. Pat. No. 3,881,179 to Howard, Jr.

A Kelvin-connected buried zener diode has also been used in a voltage reference circuit as shown in FIG. 16 in the article "Circuit Techniques For Achieving High Speed-High Resolution A/D Conversion", IEEE Journal of Solid-State Circuits, Vol. SC-15, No. 6, pp. 1040-1050 (1980). In this circuit, one anode of the zener is fed with a bias current, while the other anode is used as a sense connection for error correction circuitry which compensates for both temperature and voltage variations in the diode. Finally, it is also known in the prior art to provide voltage reference circuits comprising a negative temperature coefficient diode-connected transistor in series with a positive temperature coefficient zener diode such that the overall temperature coefficient of the circuit is minimized. Such a structure is seen in U.S. Pat. No. 4,258,311 to Tokuda et al.

The prior art voltage reference circuits discussed above are reasonably efficient for non-precision applications, however, these circuits have inherent problems due to their design. For example, when a series combination of a buried zener and a forward-biased base-emitter diode are used as the voltage reference circuit, the inherent series resistance in the buried side of the zener affects the temperature sensitivity of the circuit. In particular, the temperature coefficient of the voltage drop across the series resistance cannot be readily compensated for by the base-emitter diode. The Kelvin-connected structure ameliorates this problem by separating the voltage drop from the voltage sense path thereby allowing the use of error correction circuitry, as described in the article referenced above. The use of correction circuitry to absorb and track the varying voltage difference between the Kelvin contacts, however, makes such a circuit prohibitively expensive. Moreover, such additional circuitry is inefficient when a single supply system is used; i.e., where the reference voltage is referenced to ground.

It is, therefore, desirable to provide a Kelvin-connected buried zener reference circuit which does not require extra compensation circuitry and which can be economically produced.

OBJECTS OF THE INVENTION

It is, therefore, an object of the present invention to provide a voltage reference circuit comprising a Kelvin-connected buried zener diode which provides a temperature stable voltage reference without additional compensation circuitry.

It is another object of the present invention to provide a voltage reference circuit wherein the use of a temperature compensation diode-connected transistor across the Kelvin-connection provides temperature and voltage stability.

It is yet another object of the present invention to provide a Kelvin-connected buried zener diode voltage reference circuit which can be operated efficiently in a single supply system referenced to ground.

It is still another object of the present invention to provide a voltage reference circuit which includes a minimum number of temperature sensitive components and which is economical to produce.

These and other objects are attained by providing a voltage reference circuit comprising a series combination of a Kelvin-connected buried zener diode and a bipolar transistor. In particular, the collector of the transistor is connected to the first anode of the diode while the base of the transistor is connected to the second anode of the diode. This connection provides automatic compensation of the temperature coefficient of the voltage drop across the second anode path, this coefficient being caused by anode parasitic resistance. The transistor is of the NPN type when the buried layer of the zener is formed from a P-type material. Conversely, a PNP transistor is used when the buried layer of the zener diode is an N-type material.

BRIEF DESCRIPTION OF THE DRAWINGS

FIG. 1 shows a schematic diagram of the novel voltage reference circuit of the instant invention.

FIG. 2 shows a cross-sectional perspective of the I.C. chip incorporating the circuit of FIG. 1.

DETAILED DESCRIPTION OF THE PREFERRED EMBODIMENT

Referring now to FIG. 1, the novel voltage reference circuit 10 is shown in detail. More specifically, the circuit 10 comprises a Kelvin-connected buried zener diode 12 having first and second anodes 14 and 16, and cathode 18. An NPN transistor 20, having a base 22, collector 24, and emitter 26, is connected in series with the zener diode 12. In particular, the collector 24 of transistor 20 is connected to the first anode 14 of diode 12 while the base 22 of transistor 20 is connected to the diode's second anode 16. Therefore, the sense path of the Kelvin-connected circuit is from the cathode 18 through the second anode 16 of zener diode 12, the base 22 of transistor 20, and through to the emitter 26 of transistor 20. The current flow, however, is from the cathode 18 through the first anode 14 of zener diode 12, the collector 24 of transistor 20 and through to the emitter 26 of transistor 20. Due to its novel interconnection with the diode 12, the transistor 20, which is normally used as a negative temperature coefficient diode to offset the positive temperature coefficient of the zener, also serves to effectively compensate for the zener's anode parasitic resistances, as will be described in more detail below.

As discussed above, the design of the Kelvin-connected buried zener diode gives rise to small parasitic series resistances 28 and 30 which adversely contribute to the temperature coefficient non-linearities of the circuit 10. Specifically, in the prior art the compensation diode-connected transistor does not fully compensate for the temperature coefficient of the voltage drop across these parasitic resistances. Therefore, the overall temperature coefficient of the circuit cannot be effectively minimized for precision voltage reference applications.

The present invention provides an efficient, yet economical solution to the effects of the series parasitic resistances 28 and 30. In particular, it is the interconnection of the transistor 20 with the Kelvin-connected buried zener diode 12 as shown in FIG. 1 which provides the novel solution. With reference to FIG. 1, the current I is defined as the current into the cathode 18 of zener 12, and the current out of the emitter 26 of transistor 20. The currents in the base 22 and collector 24 of transistor 20 are related to the current I as follows:

$$I_B = \frac{I}{h_{FE} + 1}$$

$$I_C = I\left(\frac{1}{1 + \frac{1}{h_{FE}}}\right);$$

where $h_{FE}$ is the d.c. current gain of the NPN transistor 20. The current through the sense path of the circuit, or $I_B$, is reduced by a factor of $h_{FE}$ due to the interconnection of the base 22 and collector 24 of transistor 20 to first and second anodes 14 and 16 of diode 12, respectively. This reduction can be seen by comparing the ratio $I_C/I_B$;

$$\frac{I_C}{I_B} = \frac{I\left(\frac{1}{1 + \frac{1}{h_{FE}}}\right)}{\frac{I}{h_{FE} + 1}} = h_{FE}$$

Note that $h_{FE}$ is between 50 and 1000 for a typical NPN transistor. Since the current through the sense terminal or anode 16, is reduced by a factor of $h_{FE}$ from the reference operating current I, the voltage drop developed through the series resistance 30 is correspondingly reduced to a very small value. This small value, which is in the sense path, does not significantly alter the sensed voltage. The voltage drop across the other parasitic resistance 28 through which $I_C$ flows is absorbed by $V_{CB}$ of NPN transistor where it does not affect the voltage in the sense path.

It can, therefore, be seen that the connection of the base 22 and collector 24 to the first and second anodes 14 and 16, respectively, serves to automatically provide the required voltage compliance beteen the Kelvin terminals without the need of additional circuitry. The circuit is economical since the diode-connected transistor 20 is already present for compensating the overall temperature coefficient of the circuit 10. Therefore, the instant invention can be easily incorporated into the prior art voltage reference circuits by externally connecting the zener diode 12 and transistor 20 as shown in FIG. 1. Further, the amount of compensation provided by the interconnection described above can be tailored by simply designing the transistor with a desired value of $h_{FE}$.

Referring now to FIG. 2, a cross-sectional perspective of the I.C. chip incorporating the above circuit is shown in detail with reference numbers carried over from FIG. 1. The Kelvin-connected buried zener diode 12 of FIG. 1 is formed on a substrate 40 of N-type material. The buried layer 42 is a deep P+-type diffusion formed in the substrate 40. A shallow P-type diffusion 44 is then made over the deep P+-type diffusion 42. The P-type diffusion 44 is laterally wider than the buried layer 42. Finally, a shallow N+-type layer 46 is diffused centrally over the preceding diffusions to form the cathode 18. The anode connections 14 and 16 are taken from the metal interconnect terminals 48 and 50, respectively. This structure is conventional in the prior art.

The NPN transistor 20 is formed adjacent the buried zener diode 12 as seen in FIG. 2. In particular, a P-type diffusion 52 is made into the substrate 40 to form the base 22 of the transistor 20. An N+-type diffusion 54 is made in the P-type diffusion to form the emitter 26 of transistor 20 and an N+ diffusion 56 is made in the island 40 to form a collector contact. The novel interconnection of the diode 12 and transistor 20 of FIG. 1 can now be easily provided by connecting the first anode 14 of diode 12 to the collector interconnect terminal 58 via external conductor 60. The base 22 of transistor 20 is connected to the second anode 16 of the zener diode 12 via terminal 56 and external conductor 62.

The circuit structure of FIG. 2 is in no way meant to be limiting. It is envisioned that other types of monolithic structures can be used as well. Further, FIGS. 1 and 2 disclose a PN buried zener with a buried P-type layer and a surface N-type layer. With this structure, the transistor 20 is of the NPN type. Conversely, if the zener comprises an N-type buried layer and a P-type surface layer, the transistor 20 should be of the PNP-type. Also, the process steps used to form the buried zener diode may also be used to form the transistor. For symmetrical zener diode structure, the anodes 14 and 16 are interchangeable. For asymmetrical zener diode structures, the anode with the lowest parasitic or series resistance should be connected to the collector as 14 and 28, respectively, and the anode with the higher parasitic or series resistance be connected to the base as 16 and 30, respectively.

It can, therefore, be seen that a novel voltage reference circuit has been provided which does not require additional compensation circuitry. In particular, the specific connection of the NPN transistor and the Kelvin-connected buried zener described in FIGS. 1 and 2 provides self-compensation of the temperature coefficient of the voltage drop across the zener's parasitic resistances. This compensation minimizes the number of temperature sensitive elements and the need for additional error correction circuitry thereby making the circuit economical to produce.

Although the invention has been described in detail, it is to be clearly understood that the same is by way of illustration and example only and is not to be taken by way of limitation, the spirit and scope of the invention being limited only to the terms of the appended claims.

What is claimed is:

1. A voltage reference circuit comprising:
    a buried zener diode having first and second anodes and a cathode, said first and second anodes having inherent parasitic resistances; and
    a transistor having a base, collector, and emitter, said collector connected to said first anode, said base connected to said second anode, said transistor serving to compensate for voltage variations in said zener diode caused by said parasitic resistances and external temperature changes.

2. A voltage reference circuit as described in claim 1 wherein said buried zener diode has a P-type buried layer and an N-type surface layer such that the PN junction of said diode is buried.

3. A voltage reference circuit as described in claim 2 wherein said transistor is an NPN bipolar transistor.

4. A voltage reference circuit as described in claim 1 wherein said buried zener diode has an N-type buried layer and a P-type surface layer such that the PN junction of said diode is buried.

5. A voltage reference circuit as described in claim 4 wherein said transistor is a PNP bipolar transistor.

6. A voltage reference circuit as described in claim 1 wherein said buried zener diode and said transistor are formed on the same monolithic chip to improve the sensitivity of said circuit.

7. A voltage reference circuit as described in claim 1 wherein said transistor and said buried zener diode have opposite temperature coefficients to compensate said circuit for said external temperature changes.

8. A voltage reference circuit as described in claim 1 wherein said first anode has a lower inherent parasitic resistance than said second anode.

* * * * *